(12) United States Patent
Bae et al.

(10) Patent No.: US 12,683,132 B2
(45) Date of Patent: Jul. 14, 2026

(54) SEMICONDUCTOR MANUFACTURING FACILITY AND METHOD OF OPERATING THE SAME

(71) Applicants:LOT CES CO., LTD., Osan-si (KR); LOT VACUUM CO., LTD., Osan-si (KR)

(72) Inventors: Jin Ho Bae, Hwaseong-si (KR); Jong Taek Lee, Hwaseong-si (KR); Min Jae Kim, Ansan-si (KR)

(73) Assignees: LOT CES CO., LTD., Osan-si (KR); LOT VACUUM CO., LTD., Osan-si (KR)

( * ) Notice: Subject to any disclaimer, the term of this patent is extended or adjusted under 35 U.S.C. 154(b) by 387 days.

(21) Appl. No.: 18/278,180

(22) PCT Filed: Mar. 31, 2022

(86) PCT No.: PCT/KR2022/004605
§ 371 (c)(1),
(2) Date: Aug. 22, 2023

(87) PCT Pub. No.: WO2022/215948
PCT Pub. Date: Oct. 13, 2022

(65) Prior Publication Data
US 2024/0128065 A1     Apr. 18, 2024

(30) Foreign Application Priority Data

Apr. 6, 2021   (KR) ........................ 10-2021-0044428
Jan. 25, 2022   (KR) ........................ 10-2022-0010492

(51) Int. Cl.
*H01J 37/32* (2006.01)
*C23C 16/26* (2006.01)
(Continued)

(52) U.S. Cl.
CPC ........ *H01J 37/32844* (2013.01); *C23C 16/26* (2013.01); *C23C 16/4412* (2013.01);
(Continued)

(58) Field of Classification Search
CPC ......... H01L 21/02115; H01L 21/02271; H01L 21/0228; H01L 21/02304; H01L 21/02312;
(Continued)

(56) References Cited

U.S. PATENT DOCUMENTS

| | | | |
|---|---|---|---|
| 2009/0246399 A1 | 10/2009 | Goundar et al. | |
| 2010/0311251 A1 | 12/2010 | Okada et al. | |
| 2012/0238107 A1* | 9/2012 | Okada ................. | C23C 16/0209 |
| | | | 257/E21.294 |

FOREIGN PATENT DOCUMENTS

| | | |
|---|---|---|
| JP | 2007-103583 A | 4/2007 |
| JP | 2012-039084 A | 2/2012 |

(Continued)

OTHER PUBLICATIONS

International Search Report for PCT/KR2022/004605 mailed Jun. 30, 2022 from Korean Intellectual Property Office.

(Continued)

*Primary Examiner* — Edward Chin
(74) *Attorney, Agent, or Firm* — Revolution IP, PLLC

(57) ABSTRACT

A semiconductor manufacturing facility includes: a process chamber in which an amorphous carbon layer (ACL) process in which amorphous carbon is deposited so that an ACL is formed, is performed; a vacuum pump in which a residual gas generated in the process chamber is discharged from the process chamber while the ACL process is performed; a chamber exhaust pipe through which the process chamber and the vacuum pump communicate with each other; a plasma reactor configured to form a plasma reaction region using plasma; and a gas supplying device configured to supply a treatment gas to the plasma reactor.

5 Claims, 13 Drawing Sheets

(51) Int. Cl.

| | | |
|---|---|---|
| *C23C 16/44* | (2006.01) | |
| *C23C 16/50* | (2006.01) | |
| *H10P 14/69* | (2026.01) | |

(52) U.S. Cl.
CPC ........ *C23C 16/50* (2013.01); *H01J 37/32449* (2013.01); *H10P 14/6902* (2026.01); *H01J 2237/182* (2013.01); *H01J 2237/332* (2013.01)

(58) Field of Classification Search
CPC .......... H01L 21/0234; H01L 21/67017; H01L 21/67034; H01L 21/02046
See application file for complete search history.

(56) References Cited

FOREIGN PATENT DOCUMENTS

| | | | |
|---|---|---|---|
| JP | 2021-31747 A | 3/2021 | |
| KR | 10-2008-0102928 A | 11/2008 | |
| KR | 10-2009-0057487 A | 6/2009 | |
| KR | 10-1326704 B1 | 11/2013 | |
| KR | 10-2015-0058739 A | 5/2015 | |
| KR | 20150058739 A * | 5/2015 | ........ H01J 37/32834 |
| KR | 101792633 B1 * | 11/2017 | ....... H01L 21/02046 |
| KR | 10-2019-0019651 A | 2/2019 | |
| KR | 10-2155631 B1 | 9/2020 | |
| KR | 20230134795 A * | 9/2023 | ............. C23C 16/14 |
| TW | 1686880 B * | 3/2020 | ........... C23C 14/021 |
| WO | WO-2024128635 A1 * | 6/2024 | ............. H10P 72/00 |

OTHER PUBLICATIONS

Office Action of Chinese Patent Application No. 202280019309.8 dated Apr. 23, 2025.

Office Action of Chinese Patent Application No. 202280019309.8 dated Sep. 25, 2025.

Gave et al., "Plasma Science and Technology and its application in industry", China Light Industry Press, Jan. 2011, p. 119.

* cited by examiner

ACL PROCESS — S100

STOP PROCESS — S110

REMOVE DEPOSITED MATERIAL — S120

FIG. 10

```
┌─────────────────────────────┐
│                             │
│        ACL PROCESS          │── S200
│                             │
└─────────────────────────────┘
              │
              ▼
┌─────────────────────────────┐
│                             │
│          EXHAUST            │── S210
│                             │
└─────────────────────────────┘
              │
              ▼
┌─────────────────────────────┐
│                             │
│        GAS TREATMENT        │── S220
│                             │
└─────────────────────────────┘
```

FIG. 12

SEMICONDUCTOR MANUFACTURING FACILITY AND METHOD OF OPERATING THE SAME

TECHNICAL FIELD

The present invention relates to a technique for treating an exhaust gas, and more particularly, to a technique for treating an exhaust gas generated in a semiconductor manufacturing process using plasma.

BACKGROUND ART

Semiconductor devices are being manufactured by repeatedly performing processes such as photolithography, etching, diffusion, and metal deposition on a wafer in a process chamber by using various process gases. After a semiconductor process is completed, a residual gas exists in the process chamber, and because the residual gas in the process chamber includes harmful components such as toxic components, the residual gas is discharged by a vacuum pump and is purified by an exhaust gas treatment device such as a scrubber.

An amorphous carbon layer (ACL) process is a process in which amorphous carbon is deposited in a semiconductor manufacturing process so that an ACL is formed. The residual gas generated in the process chamber after the ACL process is performed, is discharged from the process chamber by the vacuum pump so that an exhaust gas is formed. The exhaust gas in the ACL process includes hydrogenated amorphous carbon (a-C:H) and hydrocarbon ($C_xH_y$). Hydrogenated amorphous carbon (a-C:H) and hydrocarbon ($C_xH_y$) included in the exhaust gas of the ACL process are deposited in the vacuum pump, which are causes of deteriorating the performance of the vacuum pump and reducing mean time between failure (MTBF) of the vacuum pump.

DETAILED DESCRIPTION OF THE INVENTION

Technical Problem

The present invention provides a semiconductor manufacturing facility in which hydrogenated amorphous carbon (a-C:H) and hydrocarbon ($C_xH_y$) that are deposited in a vacuum pump in an amorphous carbon layer (ACL) process facility and are used to form a layer are removed, and a method of operating the semiconductor manufacturing facility.

The present invention also provides a semiconductor manufacturing facility in which hydrogenated amorphous carbon (a-C:H) and hydrocarbon ($C_xH_y$) that are discharged from a process chamber in an amorphous carbon layer (ACL) process facility are prevented from being introduced into a vacuum pump, and a method of operating the semiconductor manufacturing facility.

Technical Solution

According to an aspect of the present invention, there are provided a semiconductor manufacturing facility including: a process chamber in which an amorphous carbon layer (ACL) process in which amorphous carbon is deposited so that an ACL is formed, is performed; a vacuum pump in which a residual gas generated in the process chamber is discharged from the process chamber while the ACL process is performed; a chamber exhaust pipe through which the process chamber and the vacuum pump communicate with each other; a plasma reactor configured to form a plasma reaction region using plasma; and a gas supplying device configured to supply a treatment gas to the plasma reactor, wherein the residual gas is discharged from the process chamber, flows along the chamber exhaust pipe so that an exhaust gas is formed, and the treatment gas is decomposed by plasma in the plasma reaction region so that reactive species are formed, and the reactive species are supplied to the chamber exhaust pipe, and the treatment gas is oxygen ($O_2$) or nitrogen trifluoride ($NF_3$), and a method of operating the semiconductor manufacturing facility.

Effects of the Invention

According to the present invention, the objectives of the present invention described above can be achieved. Specifically, an oxygen gas supplied to a plasma reactor is decomposed in a plasma region of the plasma reactor so that heated reactive oxygen can be generated, and the generated reactive oxygen is introduced into the vacuum pump and reacts with hydrogenated amorphous carbon that is deposited in the vacuum pump so that hydrogenated amorphous carbon deposited in the vacuum pump can be removed.

Furthermore, hydrogenated amorphous carbon (a-C:H) reacts with an oxygen gas additionally supplied by plasma reaction in a plasma reaction region of a plasma reactor so that carbon dioxide gas, carbon monoxide gas, and water vapor can be generated. Thus, hydrogenated amorphous carbon (a-C:H) is prevented from being included in gas introduced into the vacuum pump.

In addition, hydrocarbon ($C_xH_y$) deposited in the vacuum pump is removed by reacting with fluorine ($F_2$) generated by decomposing nitrogen trifluoride ($NF_3$) into plasma so that deterioration of the performance of the vacuum pump can be prevented.

In addition, hydrocarbons ($C_xH_y$) included in the exhaust gas are decomposed by a plasma reaction together with nitrogen trifluoride ($NF_3$) in the plasma reaction region so that deterioration of the performance of the vacuum pump can be prevented.

DESCRIPTION OF THE DRAWINGS

FIG. 4 is a view schematically illustrating the configuration of an ignition system used in the plasma apparatus of the semiconductor manufacturing facility shown in FIG. 1.

FIG. 5 is a flowchart schematically illustrating a method of operating a semiconductor manufacturing facility according to an embodiment.

FIG. 10 is a flowchart schematically illustrating a method of operating a semiconductor manufacturing facility according to another embodiment of the present to invention.

FIG. 12 is a block diagram illustrating a schematic configuration of a semiconductor manufacturing facility according to another embodiment of the present invention.

MODE OF THE INVENTION

Hereinafter, the configuration and operation of the present invention will be described in detail with reference to the accompanying drawings.

Figure 1:
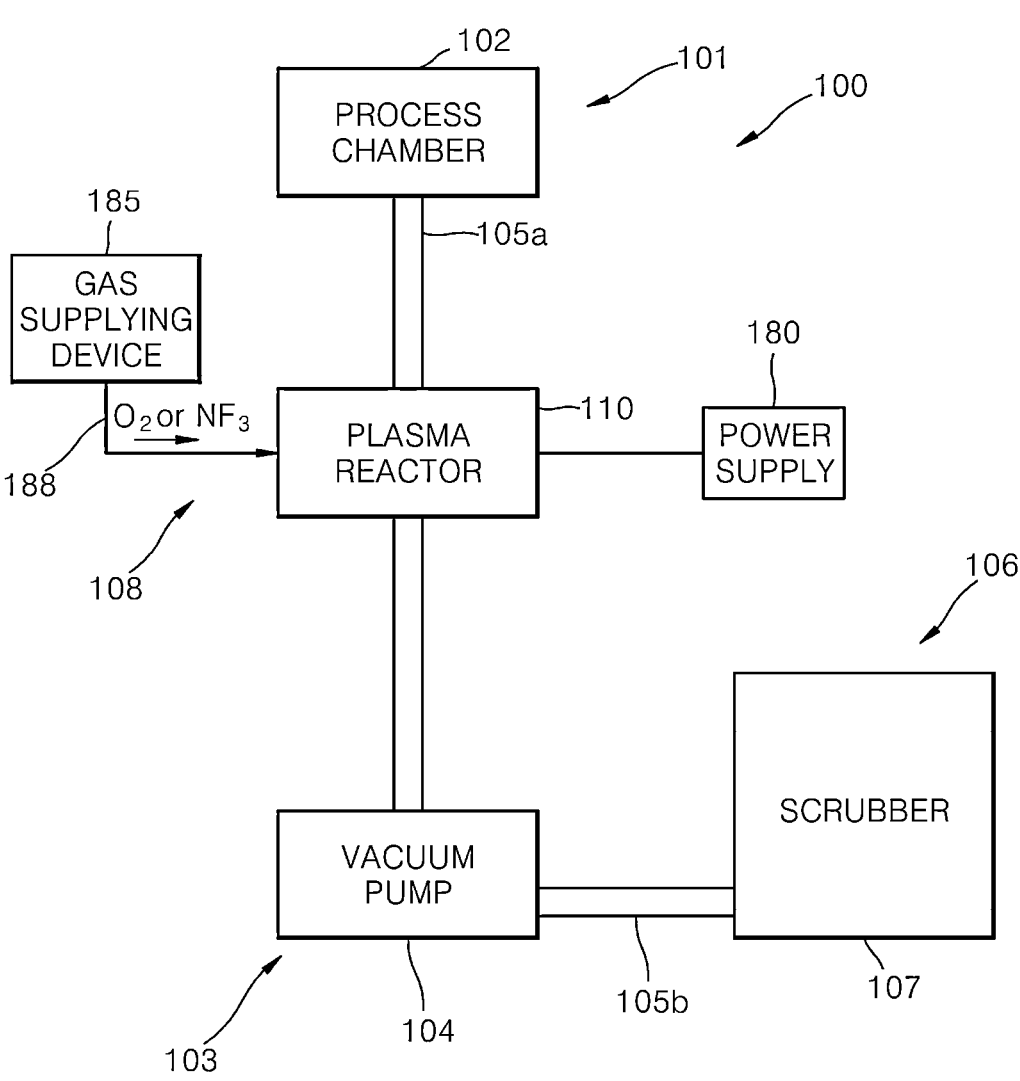
FIG. 1 is a block diagram illustrating a schematic configuration of a semiconductor manufacturing facility according to an embodiment of the present invention.

In FIG. 1, a schematic configuration of a semiconductor manufacturing facility according to an embodiment of the present invention is installed, is illustrated as a block diagram. Referring to FIG. 1, a semiconductor manufacturing facility 100 according to an embodiment of the present invention includes a semiconductor manufacturing equipment 101 in which a semiconductor manufacturing process of manufacturing a semiconductor device is performed, an exhaust equipment 103 in which gas is discharged from the semiconductor manufacturing equipment 101, an exhaust gas treatment equipment 106 in which gas discharged by the exhaust equipment 103 from the semiconductor manufacturing equipment 101 is treated, and a plasma apparatus 108 for treating hydrogenated amorphous carbon (a-C:H) and hydrocarbon ($C_XH_Y$) by using plasma.

The semiconductor manufacturing equipment 101 includes a process chamber 102 in which a semiconductor manufacturing process is performed using various process gases. The process chamber 102 includes all types of process chambers generally used for semiconductor manufacturing in the field of semiconductor manufacturing facility technology. A residual gas generated in the process chamber 102 is purified by the exhaust gas treatment equipment 106 while being discharged by the exhaust equipment 103 to the outside. In the present embodiment, it will be described that a general amorphous carbon layer (ACL) process is performed in the process chamber 102. In general, the ACL process means a process in which amorphous carbon is deposited to form an ACL, in the semiconductor process. After the ACL process is performed, the residual gas including hydrogenated amorphous carbon (a-C:H) and hydrocarbon ($C_XH_Y$) is generated in the process chamber 102. The residual gas including hydrogenated amorphous carbon (a-C:H) and hydrocarbon ($C_XH_Y$) generated in the process chamber 102 after the ACL process is performed, is discharged by the exhaust equipment 103 from the process chamber 102.

The exhaust equipment 103 discharges the residual gas including hydrogenated amorphous carbon (a-C:H) and hydrocarbon ($C_XH_Y$) generated in the process chamber 102 after the ACL process is performed. The exhaust equipment 103 includes a vacuum pump 104, a chamber exhaust pipe 105*a*, which connects the process chamber 102 to the vacuum pump 104 and in which the residual gas discharged from the process chamber 102 flows as an exhaust gas, and a pump exhaust pipe 105*b*, which extends from the vacuum pump 104 downstream and in which the exhaust gas flows.

The vacuum pump 104 forms a negative pressure to the process chamber 102 through the chamber exhaust pipe 105*a* that connects the process chamber 102 to the vacuum pump 104 so as to discharge the residual gas of the process chamber 102. Because the vacuum pump 104 includes the configuration of a vacuum pump generally used in the field of semiconductor manufacturing facility technology, a detailed description thereof will be omitted. Hydrogenated amorphous carbon (a-C:H) and hydrocarbon ($C_XH_Y$) included in the exhaust gas are introduced into the vacuum pump 104 through the chamber exhaust pipe 105*a*, and hydrogenated amorphous carbon (a-C:H) and hydrocarbon ($C_XH_Y$) are deposited in the vacuum pump 104 so that a layer can be formed. Hydrogenated amorphous carbon (a-C:H) and hydrocarbon ($C_XH_Y$) that are deposited in the vacuum pump 104 and used to form a layer, degrades the performance of the vacuum pump 104 and reduces mean time between failure (MTBF) of the vacuum pump 104. Hydrogenated amorphous carbon (a-C:H) and hydrocarbon ($C_XH_Y$) deposited in the vacuum pump 104 may be removed by an action of the plasma apparatus 108.

The chamber exhaust pipe 105*a* connects an exhaust port of the process chamber 102 to an inlet of the vacuum pump 104 between the process chamber 102 and the vacuum pump 104. Due to the negative pressure formed by the vacuum pump 104, the residual gas of the process chamber 102 is discharged through the chamber exhaust pipe 105 so that an exhaust gas can be formed.

The pump exhaust pipe 105*b* extends from the vacuum pump 104 downstream. The pump exhaust pipe 105*b* is connected to an outlet of the vacuum pump 104 so that the exhaust gas discharged from the vacuum pump 104 flows.

The exhaust gas treatment equipment 106 treats and purifies harmful components included in the exhaust gas of the process chamber 102. The exhaust gas treatment equipment 106 includes a scrubber 107 for treating the exhaust gas. The scrubber 107 is connected to an end of a downstream side of the pump exhaust pipe 105*b* and treats the harmful components included in the exhaust gas discharged from the vacuum pump 104. The scrubber 107 includes all types of scrubbers generally used to treat the exhaust gas in the field of semiconductor manufacturing facility technology.

The plasma apparatus 108 treats hydrogenated amorphous carbon (a-C:H) and hydrocarbon ($C_XH_Y$) deposited in the vacuum pump 103. The plasma apparatus 108 generates excited oxygen atoms (O*) that are reactive species from oxygen ($O_2$) using plasma so as to remove hydrogenated amorphous carbon (a-C:H). Also, the plasma apparatus 108 generates excited fluorine atoms (F*) and fluorine ($F_2$) that are reactive species from nitrogen trifluoride ($NF_3$) using plasma so as to remove hydrocarbon ($C_XH_Y$). The plasma apparatus 108 includes a plasma reactor 110 installed on the chamber exhaust pipe 105*a*, a power supply 180 for supplying power to the plasma reactor 110, and a gas supplying device 185 for supplying an oxygen gas or $NF_3$ to the plasma reactor 110.

The plasma reactor 110 is installed on the chamber exhaust pipe 105*a* and decomposes the oxygen gas or NF$_3$ supplied from the gas supplying device 185 using plasma. In the plasma reactor 110, oxygen (O$_2$) is decomposed into the excited oxygen atoms (O*) by using plasma. Also, in the plasma reactor 110, NF$_3$ is decomposed into components including excited fluorine atoms (F*), excited nitrogen atoms (N*), fluorine (F$_2$), nitrogen (N$_2$), and electrons e by using plasma. The excited oxygen atoms (O*) generated by decomposing oxygen (O$_2$) in the plasma reactor 110 are introduced into the vacuum pump 104 and react with hydrogenated amorphous carbon (a-C:H) decomposed into the vacuum pump 104. Fluorine (F$_2$) generated by decomposing NF$_3$ in the plasma reactor 110 is introduced into the vacuum pump 104 and reacts with hydrocarbon (C$_X$H$_Y$) decomposed into the vacuum pump 104. In the present embodiment, it will be described that the plasma reactor 110 is an inductively coupled plasma (ICP) using ICP. Although, in the present embodiment, the plasma reactor 110 is described as using ICP, embodiments are not limited thereto. In the present invention, the plasma reactor includes all types of plasma reactors (e.g., a plasma reactor using capacitively coupled plasma (CCP) for generating a plasma reaction), and this also belongs to the scope of the present invention.

Figure 2:
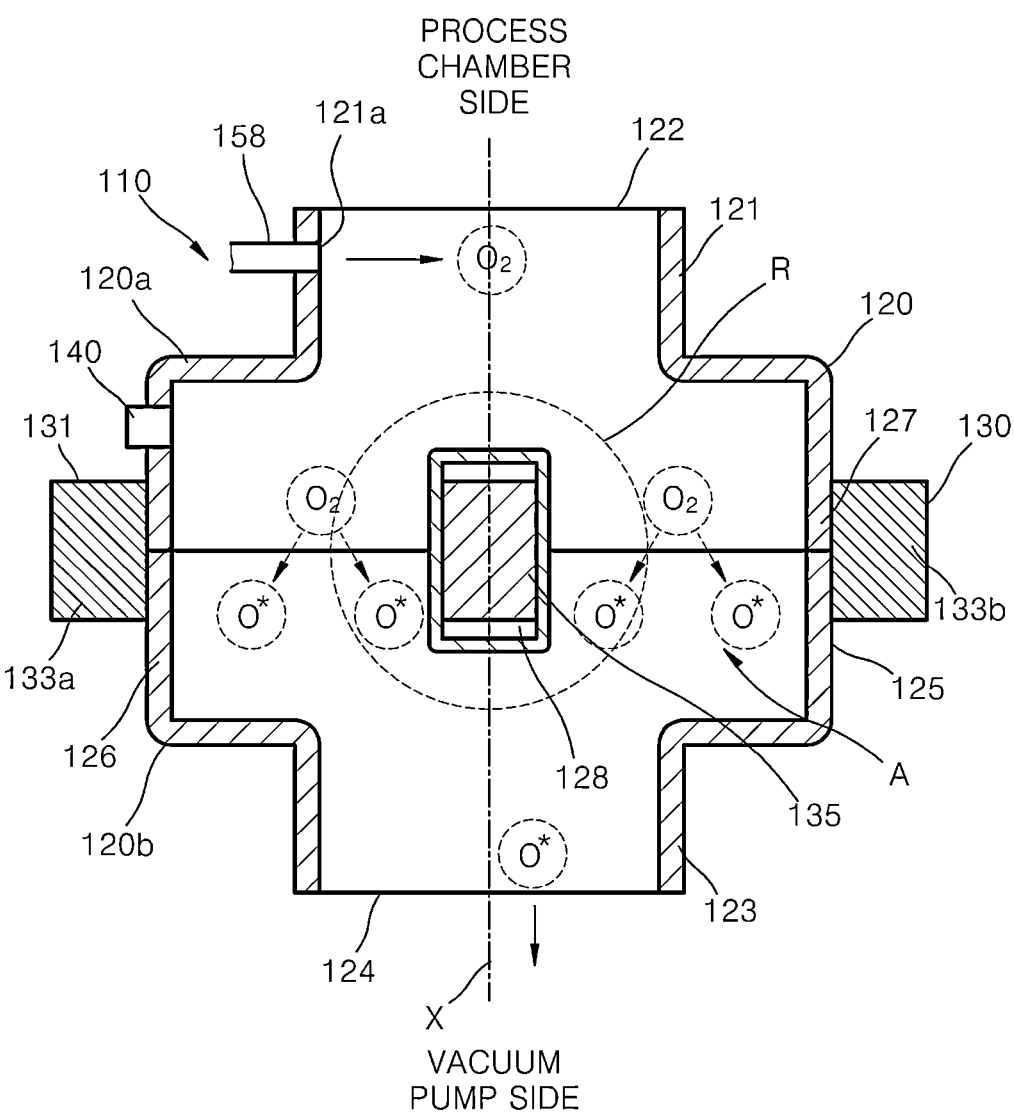
FIG. 2 is a longitudinal cross-sectional view of a plasma reactor in a plasma apparatus of the semiconductor manufacturing facility shown in FIG. 1.

In FIG. 2, the schematic configuration of the plasma reactor 110 is shown as a longitudinal cross-sectional view. Referring to FIG. 2, the plasma reactor 110 includes a reaction chamber 120, a magnetic core 130 arranged to surround the reaction chamber 120, an igniter 140 for plasma ignition, a first coil (not shown) wound on the magnetic core 130 and receiving power from the power supply 180, and a second coil (not shown) wound on the magnetic core 130 and supplying power to the igniter 140.

The reaction chamber 120 that is a toroidal chamber includes a gas inlet portion 121, a gas discharge portion 123 spaced apart from the gas inlet portion 121, and a plasma reaction portion 125, which connects the gas inlet portion 121 to the gas discharge portion 123 and in which a plasma reaction occurs. Gas discharged from the process chamber (102 of FIG. 1) is introduced into the vacuum chamber 104 via the reaction chamber 120 through the chamber exhaust pipe (105*a* of FIG. 1).

The gas inlet portion 121 has a short tubular shape extending around a straight extension axial line X, and a front end of the gas inlet portion 121 is opened so that an inlet 122 through which gas is introduced, is formed. The inlet 122 communicates with the exhaust port of the process chamber (102 of FIG. 1) through the chamber exhaust pipe (105*a* of FIG. 1). A gas injection port 121*a* through which gas supplied from the gas supplying device 185 is injected, is formed in the gas inlet portion 121.

gas discharge portion 123 has a short tubular shape that is coaxially spaced apart from the gas inlet portion 121 on the extension axial line X, and a rear end of the gas discharge portion 123 is opened so that a discharge port 124 through which gas is discharged, is formed. The discharge port 124 communicates with the inlet of the vacuum pump (104 of FIG. 1) through the chamber exhaust pipe (105*a* of FIG. 1).

The plasma reaction portion 125 connects the gas inlet portion 121 to the gas discharge portion 123 that are spaced apart from each other, and a plasma reaction region A in which a thermal reaction and a plasma reaction with respect to gas occur, is formed in the plasma reaction portion 125. The plasma reaction portion 125 includes a first connection pipe portion 126 and a second connection pipe portion 127, which are spaced apart from each other at both sides of the plasma reaction portion 125 with the extension axial line X therebetween. The first connection pipe portion 126 and the second connection pipe portion 127 extend in parallel to the extension axial line X and communicate with the gas inlet portion 121 and the gas discharge portion 123. Thus, plasma is generated along an annular discharge loop R as shown by a dashed line. Gas flowing through the gas injection port 121*a* is decomposed by plasma in the plasma reaction region A. When an oxygen gas is introduced into the gas injection port 121*a*, a decomposition reaction by plasma in the plasma reaction region A is as the following reaction formula 1 and reaction formula 2.

$$O_2+hv \rightarrow O^*+O^*$$

O*: excited oxygen atoms               [Reaction formula 1]

$$O_2+e^- \rightarrow O+O^-$$               [Reaction formula 2]

The excited oxygen atoms (O*) generated by plasma in the plasma reaction region A are heated to enhance reactivity with hydrogenated amorphous carbon. In order to increase the generation rate of the excited oxygen atoms (O*) and temperature, the higher power applied to the plasma reactor 110, the more advantageous thereto.

In the present embodiment, it will be described that the reaction chamber 120 is configured by coupling a first chamber member 120*a* and a second chamber member 120*b* to each other. The first chamber member 120*a* includes the entire gas inlet portion 121, a portion of the first connection pipe portion 126 connected to the gas inlet portion 121, and a portion of the second connection pipe portion 127. The second chamber member 120*b* includes the entire gas discharge portion 123, a portion of the first connection pipe portion 126 connected to the gas discharge portion 123, and a portion of the second connection pipe portion 127.

Figure 3:
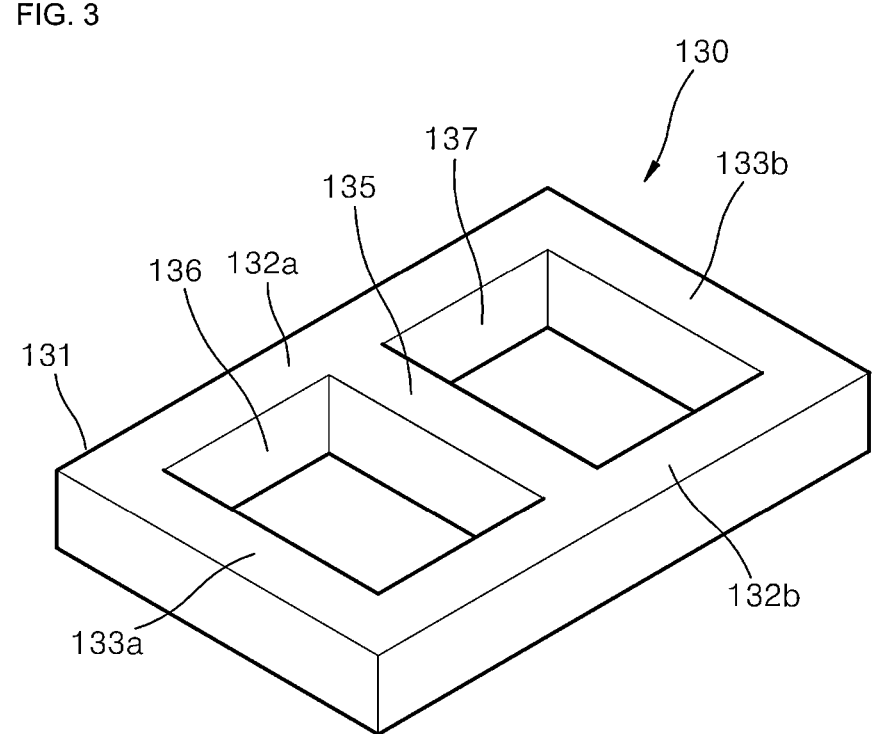
FIG. 3 is a perspective view illustrating a magnetic core shown in FIG. 2.

The magnetic core 130 is arranged to surround the reaction chamber 120. In the present embodiment, it will be described that the magnetic core 130 is a ferrite core generally used in an inductively coupled plasma generating apparatus. In FIG. 3, a perspective view of the magnetic core 130 is shown. Referring to FIGS. 2 and 3, the magnetic core 130 includes an annular ring portion 131 that surrounds the plasma reaction portion 125 of the reaction chamber 120 from the outside, and a connection portion 135 crossing an inner region of the ring portion 131.

The ring portion 131 that has a rectangular ring shape, is arranged at right angles with the extension axial line X and surrounds the plasma reaction portion 125 of the reaction chamber 120 from the outside. The rectangular ring portion 131 includes two opposite long sides 132*a* and 132*b*, and two opposite short sides 133*a* and 133*b*.

The connection portion 135 extends in a straight line to connect two opposite long sides 132*a* and 132*b* of the ring portion 131. Both ends of the connection potion 135 are connected to the center of each of two long sides 132*a* and 132*b*. The connection portion 135 is arranged to pass through a gap 128 formed between the first connection pipe portion 126 and the second connection pipe portion 127 of the reaction chamber 120. The inner region of the ring portion 131 are divided into a first through port 136 and a second through port 137 by the connection portion 135, and the first connection pipe portion 126 of the reaction chamber 120 passes through the first through port 136, and the second connection pipe portion 127 of the reaction chamber 120 passes through the second through port 137. Thus, the magnetic core 130 surrounds the first connection pipe portion 126 and the second connection pipe portion 127 of the reaction chamber 120, respectively, from the outside.

The igniter 140 ignites plasma by receiving high-voltage power from the power supply 180. In the present embodiment, it will be described that the igniter 140 is located adjacent to the gas inlet portion 121 in the plasma reaction portion 125 of the reaction chamber 120. The present invention is not limited thereto.

Figure 4:
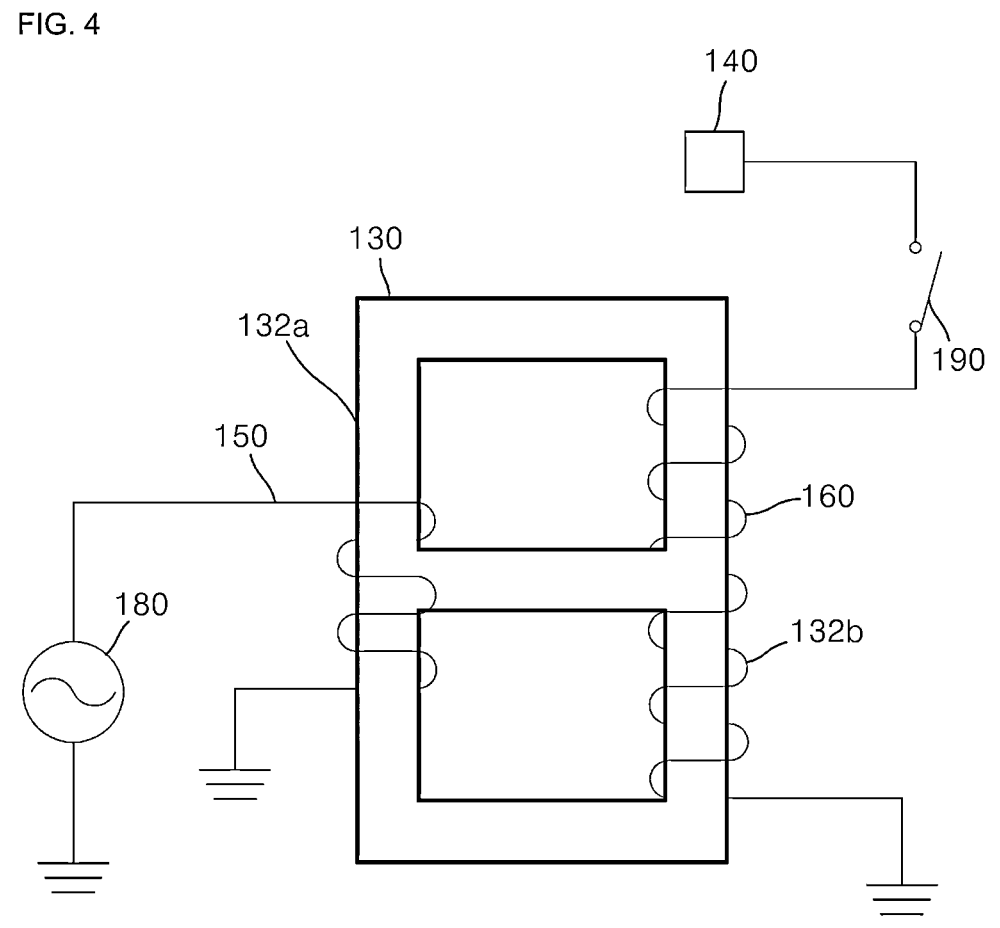

In FIG. 4, a first coil and a second coil, which are wound on the magnetic core 130 are shown. Referring to FIG. 4, a first coil 150 is wound on the first long side 132a of the magnetic core 130 and is connected to the power supply 180. The first coil 150 forms induced magnetic flux in the magnetic core 130 by receiving alternating current power having a radio frequency through the power supply 180. An induced electric field is generated by the induced magnetic flux formed in the magnetic core 130, and plasma is generated by the generated induced electric field. In the present embodiment, it will be described that the first coil 150 is wound on the magnetic core 130 twice, and the present invention is not limited thereto.

The second coil 160 is separated from the first coil 150, is wound on the second long side 132b of the magnetic core 130, and is connected to the igniter 140 through a switch circuit (relay) 190. An induced electromotive force is generated in the second coil 160 to supply power to the igniter 140. That is, the first coil 150, the second coil 160, and the magnetic core 130 perform the role of a transformer so that a high voltage for operation of the igniter 140 is formed and output in the second coil 160. To this end, the second coil 160 is wound on the magnetic core 130 with a larger number of winding than the number of winding of the first coil 150. In the present embodiment, it will be described that the second coil 160 is wound on the magnetic core 130 six times.

The power supply 180 applies the alternating current power having a radio frequency to the first coil 150 for generation of inductively coupled plasma. In the present embodiment, the first coil 150, the second coil 160, and the magnetic ore 130 function as a transformer. That is, the first coil 150, the second coil 160, and the magnetic core 130 perform the role of a primary coil, a secondary coil, and an iron core in the transformer. The number of winding of the second coil 160 is larger than the number of winding of the first coil 150 so that boosted high-voltage power can be applied to the igniter 140.

The gas supplying device 185 stores an oxygen gas or nitrogen trifluoride that is gas to be treated, and supplies the stored oxygen gas or nitrogen trifluoride to the plasma reactor 110 through a gas supply pipe 188. In the present embodiment, it will be described that the gas supply pipe 188 is connected to the gas injection port 121a formed in the gas inlet portion 121 of the reaction chamber 120 in the plasma reactor 110. As shown, an oxygen gas supplied by the gas supplying device 185 is introduced into the plasma reactor 150 is decomposed into the excited oxygen atoms (O*) heated by plasma in the plasma reaction region A of the plasma reactor 110. Although not shown, nitrogen trifluoride that is supplied by the gas supplying device 185 and introduced into the plasma reactor 150 is decomposed into fluorine atoms (F*), excited nitride atoms (N*), fluorine ($F_2$), nitride ($N_2$), and electrons (e) by plasma in the plasma reaction region A of the plasma reactor 110.

Figure 5:
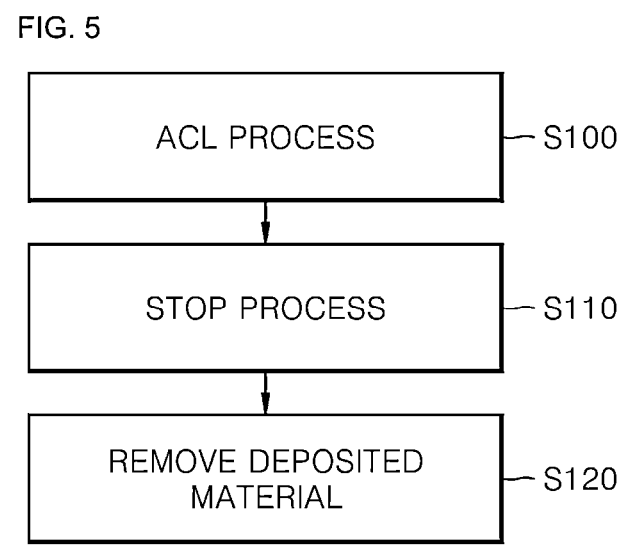

The present invention provides a method of operating a plasma apparatus for treating an exhaust gas in a process chamber. FIG. 5 is a flowchart schematically illustrating a method of operating a semiconductor manufacturing facility according to an embodiment of the present invention. The method of operating a semiconductor manufacturing facility according to an embodiment of the present invention shown in FIG. 5 that is a method of operating the semiconductor manufacturing facility 100 shown in FIG. 1 is used to remove part or whole of hydrogenated amorphous carbon and hydrocarbon deposited in the vacuum pump (104 of FIG. 1). Referring to FIGS. 1 and 2 with FIG. 5, the method of operating a semiconductor manufacturing facility according to an embodiment of the present invention includes an ACL process operation (S100) in which a deposition process of an ACL is performed in the process chamber 102, a process stopping operation (S110) in which the ACL process performed in the process chamber 102 is stopped, and a deposited material removing operation (S120) in which the process stopping operation (S110) is performed and hydrogenated amorphous carbon and hydrocarbon deposited in the vacuum pump 104 are removed in a state in which the ACL process is stopped in the process chamber 102.

In the ACL process operation (S100), a deposition process of the ACL is performed in the process chamber 102. Because the deposition process of the ACL includes the configuration of an ACL process that is generally used in a semiconductor manufacturing process, a detailed description thereof will be omitted. A residual gas generated in the process chamber 102 when the ACL process operation (S100) is performed, is discharged from the process chamber 102 through the chamber exhaust pipe 105a and the pump exhaust pipe 105b by an operation of the vacuum pump 104 so that an exhaust gas is formed. The exhaust gas in the ACL process includes hydrogenated amorphous carbon (a-C:H) and hydrocarbon ($C_XH_Y$). Hydrogenated amorphous carbon and hydrocarbon included in the ACL process are deposited in the vacuum pump 104.

In the process stopping operation (S110), the ACL process performed in the process chamber 102 and discharging of the residual gas generated by the ACL process are stopped. The process stopping operation (S110) may include stopping the process for cleaning of the process chamber 102. After the process stopping operation (S110) is performed, in a state in which the ACL process performed in the process chamber 102 and discharging of the residual gas generated by the ACL process are stopped, the deposited material removing operation (S120) is performed.

In the deposited material removing operation (S120), in the state in which the ACL process performed in the process chamber 102 and discharging of the residual gas generated by the ACL process are stopped, hydrogenated amorphous carbon and hydrocarbon deposited in the vacuum pump 104 are removed. The deposited material removing operation (S120) is performed when an oxygen gas or nitrogen trifluoride is supplied to the plasma reactor 110 by using the gas supplying device 185 in a state in which the plasma reactor 110 is activated.

When the oxygen gas is supplied to the plasma reactor 110, an oxygen ($O_2$) gas supplied to the plasma reactor 110 in operation is decomposed by plasma in the plasma reaction region A so that excited oxygen atoms (O*) heated as in the above [reaction formula 1] are generated. The heated, excited oxygen atoms (O*) generated in the plasma reactor 110 are introduced into the vacuum pump 104. Hydrogenated amorphous carbon deposited in the vacuum pump 104 reacts with the heated, excited oxygen atoms (O*) introduced into the vacuum pump 104 and is oxidized. Hydrogenated amorphous carbon is oxidized to generate carbon dioxide ($CO_2$) gas and water vapor ($H_2O$) and is removed.

Figure 6:
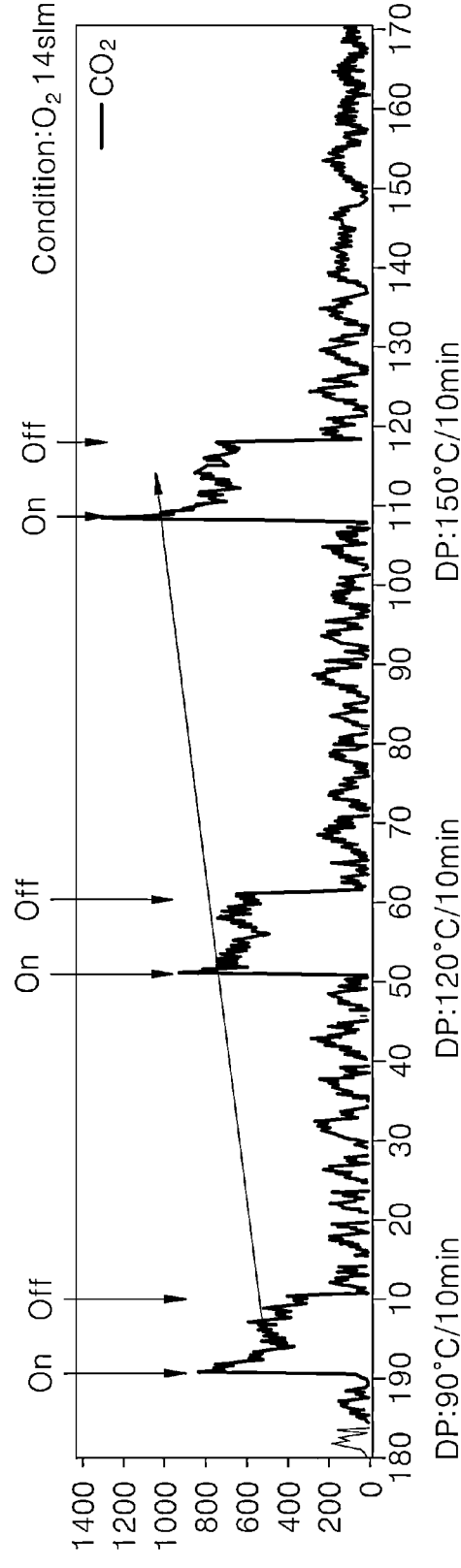
FIG. 6 is a graph showing the result of performing the method of operating a semiconductor manufacturing facility shown in FIG. 5 and illustrates a treated state of hydrogenated amorphous carbon according to an operating state of the plasma apparatus.
Figure 7:
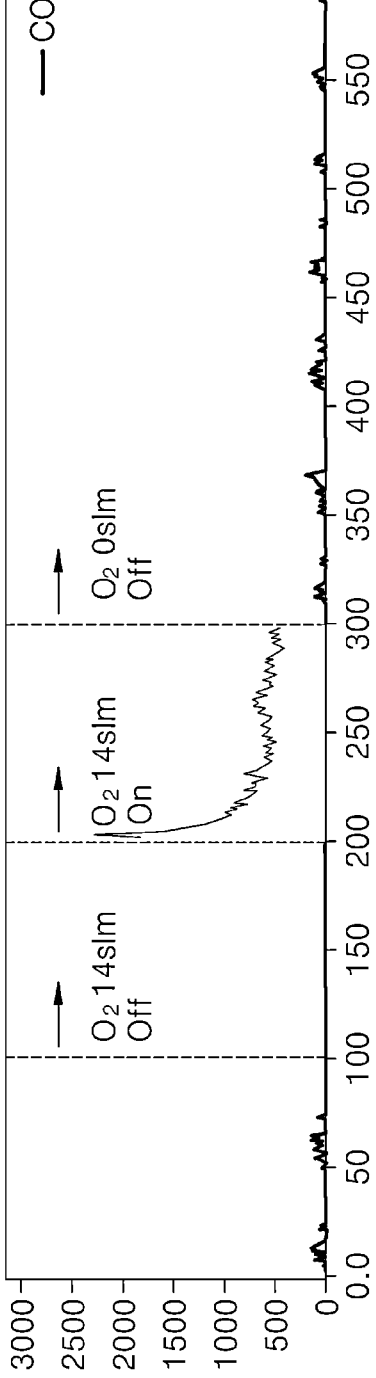
FIG. 7 is a graph showing the result of performing the method of operating a semiconductor manufacturing facility shown in FIG. 5 and illustrates a treated state of hydrogenated amorphous carbon according to the presence/absence of plasma.
Figure 8:
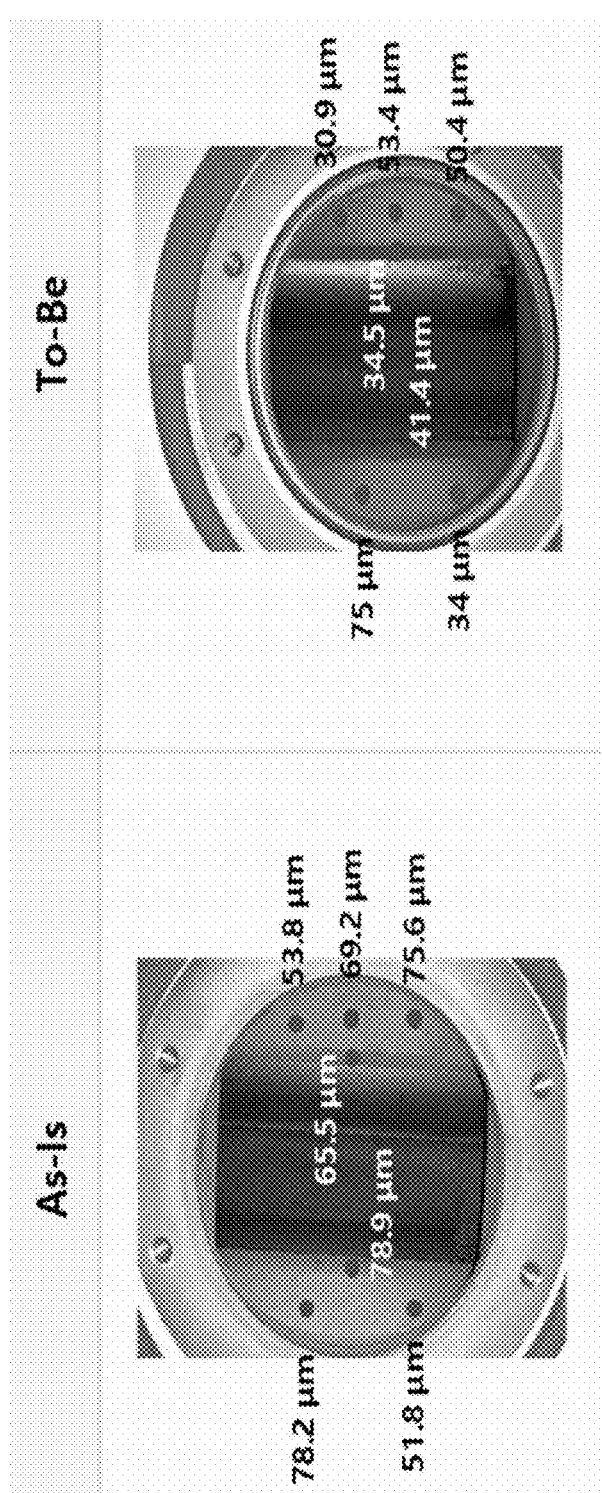
FIG. 8 is a comparative photograph showing a reduced state of a hydrogenated amorphous carbon layer in a vacuum pump as a result of the method of operating the semiconductor manufacturing facility shown in FIG. 5.

FIGS. 6 through 8 are test results showing the effect of removing the hydrogenated amorphous carbon deposited in the vacuum pump 104 according to the method of operating the semiconductor manufacturing facility shown in FIG. 5.

The graph of FIG. 6 shows the concentration of carbon dioxide ($CO_2$) in the vacuum pump 104 according to an operation state (On, Off) of the plasma apparatus 108. In the graph of FIG. 6, the horizontal axis represents time (minute), and the vertical axis represents the concentration (ppm) of carbon dioxide. According to the graph of FIG. 6, it is measured that the concentration of carbon dioxide is high in a state in which the plasma reactor 110 operates. Generation of carbon dioxide means removal using oxidization of hydrogenated amorphous carbon. Removal of hydrogenated amorphous carbon deposited in the vacuum pump 104 is ascertained from the graph of FIG. 6, and it is ascertained that the higher the temperature of the excited oxygen atoms introduced into the vacuum pump 104 is, the higher the removal effect of the hydrogenated amorphous carbon is.

The graph of FIG. 7 shows the concentration of carbon dioxide ($CO_2$) in the vacuum pump 104 according to the operation state (On, Off) of the plasma reactor 110. In the graph of FIG. 7, the horizontal axis represents time (minute), and the vertical axis represents the concentration (ppm) of carbon dioxide. According to the graph of FIG. 7, it is ascertained that when only oxygen is supplied without plasma, there is little effect of removing hydrogenated amorphous carbon deposited in the vacuum pump 104 and when the heated, excited oxygen atoms (O*) generated by plasma are supplied, there is the effect of removing hydrogenated amorphous carbon deposited in the vacuum pump 104.

Photos of FIG. 8 show the removal effect of hydrogenated amorphous carbon deposited in the vacuum pump 104 by the plasma apparatus 108. The left photo of FIG. 8 shows that when the plasma apparatus 108 does not operate, the thicknesses of deposited materials in the vacuum pump 104 are indicated according to positions, and the right photo of FIG. 8 shows that when the plasma apparatus 108 operates, the thicknesses of the deposited materials in the vacuum pump 104 are indicated according to positions. According to FIG. 8, it is ascertained that the average thickness of the deposited materials in the photo data on the left is 67.6 μm, the average thickness of the deposited materials in the photo data on the right is 45.7 μm and the deposition thicknesses of by-products are reduced by about 32% due to an action of the plasma apparatus 108.

Figure 9:
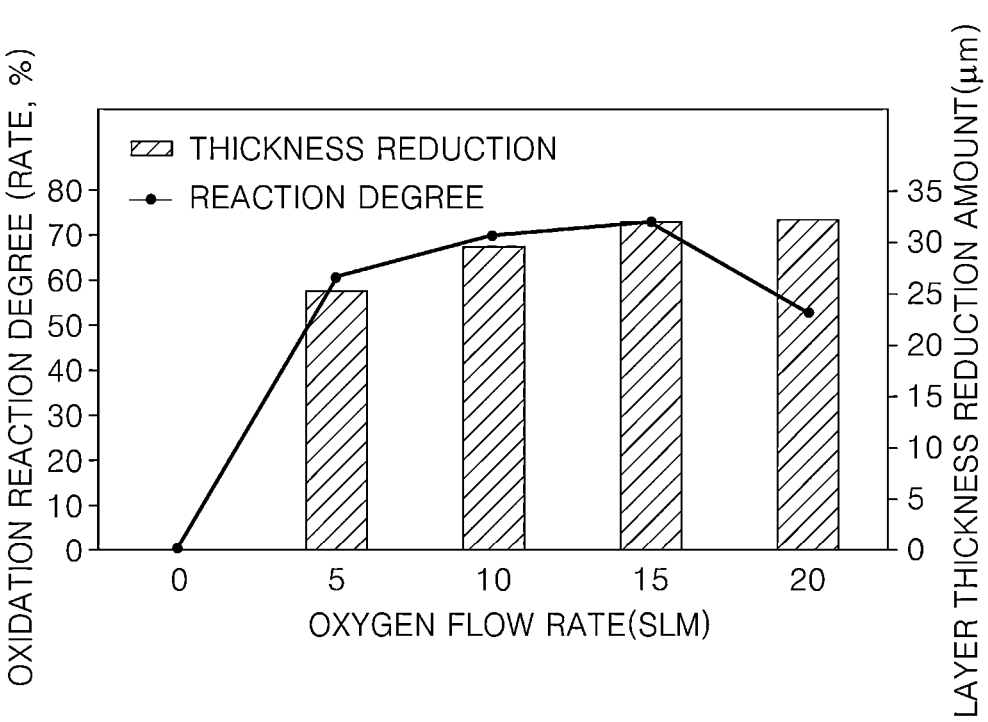
FIG. 9 is a graph showing a relationship between an oxygen supply flow rate and a reduction amount of hydrogenated amorphous carbon in the method of operating the semiconductor manufacturing facility shown in FIG. 5.

The experimental data graph of FIG. 9 shows the relationship between an oxygen flow rate supplied to the plasma reactor 110 that operates by applied power of 7 kW and the removal efficiency of hydrogenated amorphous carbon deposited in the vacuum pump 104. In FIG. 9, the horizontal axis represents the oxygen flow rate (slm) supplied to the plasma reactor 110, and the left vertical axis represents an oxidation reaction participation rate (%) of oxygen supplied to the plasma reactor 110, and the right vertical axis represents a thickness reduction amount (μm) of a hydrogenated amorphous carbon layer deposited in the vacuum pump 104. Referring to FIG. 9, it is ascertained that when the oxygen flow rate supplied to the plasma reactor 110 is 15 slm, there is the most excellent removal efficiency of hydrogenated amorphous carbon deposited in the vacuum pump 104. This means that as the oxygen flow rate supplied to the plasma reactor 110 is increased from 0 slm to 15 slm, the amount of the excited oxygen atoms (O*) is also increased but in a range where the oxygen flow rate supplied to the plasma reactor 110 is 15 slm or more, due to the limitation of plasma of the plasma reactor 110, the amount of the excited oxygen atoms (O*) is not increased any more. Thus, oxygen is supplied to the plasma reactor 110 with an oxygen flow rate indicating the generation rate of the best excited oxygen atoms (O*) according to the operation power of the plasma reactor 110 to prevent consumption of unnecessary oxygen so that efficiency can be increased. Also, the oxidation reaction degree of hydrogenated amorphous carbon deposited in the vacuum pump 104 is increased in proportion to the temperature inside the vacuum pump 104 within an upper limit value. Thus, it is advantageous to apply high power to the plasma reactor 110 so as to increase the temperature of the excited oxygen atoms (O*) generated in the plasma reactor 110.

In the present embodiment, the thickness reduction rate of a hydrogenated amorphous carbon layer deposited in the vacuum pump 104 satisfies the following proportional relation formula.

[Proportional Formula]

Thickness reduction rate of carbon layer $\propto$ oxygen flow rate (slm)×reaction time (min.)×temperature (K)

Although not shown, when nitrogen trifluoride ($NF_3$) is supplied to the plasma reactor 110, nitrogen trifluoride supplied to the plasma reactor 110 in operation is decomposed into components including fluorine atoms (F*) excited by plasma in the plasma reaction region A, excited nitrogen atoms (N*), fluorine ($F_2$), nitrogen ($N_2$), and electrons e. Fluorine ($F_2$) generated by decomposition of nitrogen trifluoride in the plasma reactor 110 is introduced into the vacuum pump 104. Fluorine ($F_2$) introduced into the vacuum pump 104 reacts with hydrocarbon ($C_XH_Y$) deposited in the vacuum pump 104 so that carbon tetrafluorocarbon ($CF_4$) and hydrofluoric acid (HF) are generated and thus hydrocarbon ($C_XH_Y$) is removed.

Figure 10:
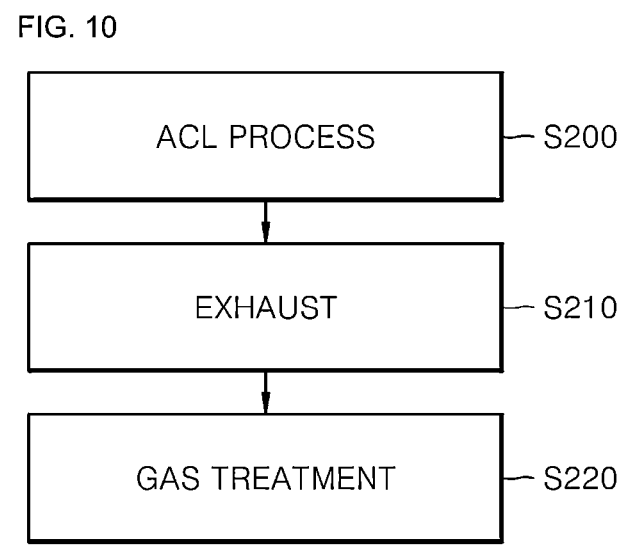

FIG. 10 is a flowchart schematically illustrating a method of operating a semiconductor manufacturing facility according to another embodiment of the present invention. The method of operating the semiconductor manufacturing facility according to another embodiment of the present invention shown in FIG. 10 is the method of operating the semiconductor manufacturing facility 100 shown in FIG. 1. Referring to FIG. 1 with FIG. 10, the method of operating the semiconductor manufacturing facility according to another embodiment of the present invention includes an ACL process operation (S200) in which a deposition process of the ACL is performed in the process chamber 102, an exhaust operation (S210) in which the residual gas in the process chamber 102 generated in the ACL process operation (S200) is discharged from the process chamber 102 by operating the exhaust equipment 103 so that an exhaust gas is formed, and a gas treatment operation (S220) in which hydrogenated amorphous carbon (a-C:H) and hydrocarbon ($C_XH_Y$ included in the exhaust gas formed in the exhaust operation (S210) are treated.

In the ACL process operation (S200), a deposition process of the ACL is performed in the process chamber 102. Because the deposition process of the ACL includes the configuration of the ACL process that is generally used in the semiconductor manufacturing process, a detailed description thereof will be omitted. The residual gas generated in the process chamber 102 when the ACL process operation (S200) is performed, is discharged from the process chamber 102 through the chamber exhaust pipe 105a and the pump exhaust pipe 105b by an operation of the vacuum pump 104 so that an exhaust gas is formed. The exhaust gas in the ACL process includes hydrogenated amorphous carbon (a-C:H) and hydrocarbon ($C_XH_Y$).

In the exhaust operation (S210), after the ACL process operation (S200) is finished, the vacuum pump 104 of the exhaust equipment 103 operates so that the residual gas in the process chamber 102 generated in the ACL process operation (S200) is discharged from the process chamber 102. The residual gas discharged from the process chamber 102 flows along the chamber exhaust pipe 105a and the pump exhaust pipe 105b to form an exhaust gas and is introduced into the scrubber 107. While the exhaust operation (S210) is performed, the gas treatment operation (S220) is performed together.

In the gas treatment operation (S220), hydrogenated amorphous carbon (a-C:H) or hydrocarbon ($C_XH_Y$) included in the exhaust gas are treated to be removed before introduced into the vacuum pump 104. In the gas treatment operation (S220), the plasma reactor 110 operates, and an oxygen gas or nitrogen trifluoride is supplied by the gas supplying device 185 to the plasma reactor 110.

Figure 11:
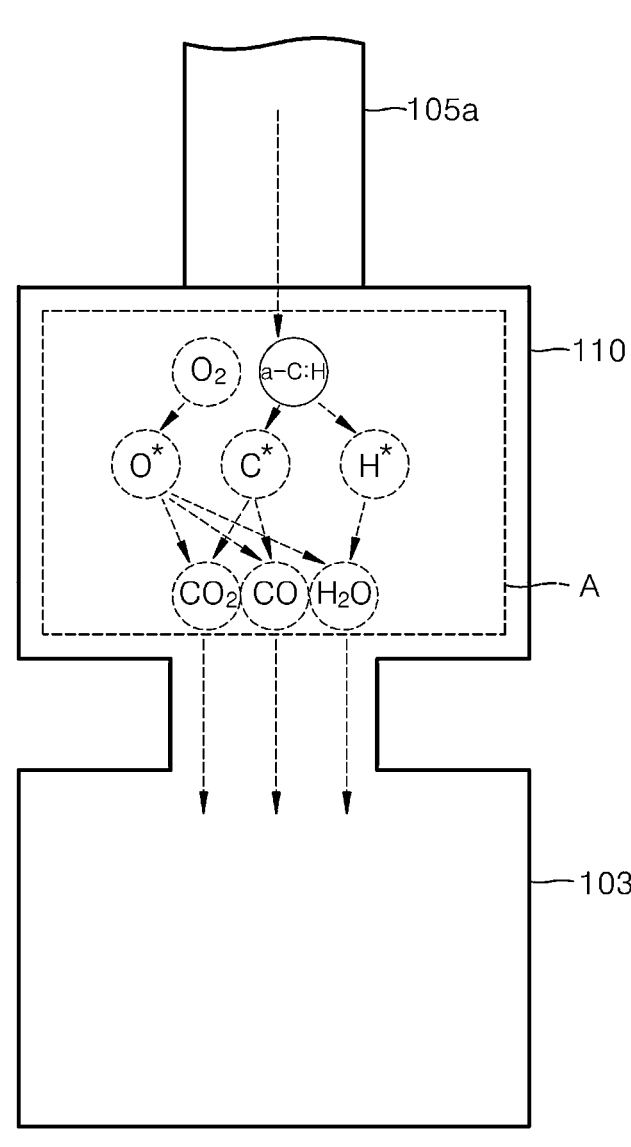
FIG. 11 is a view schematically illustrating a state in which hydrogenated amorphous carbon (a-C:H) is treated in a plasma reactor according to the method of operating the semiconductor manufacturing facility shown in FIG. 10.

A process in which hydrogenated amorphous carbon (a-C:H) included in the exhaust gas is treated, in the gas treatment operation (S220) is as shown in FIG. 11. Referring to FIG. 11, hydrogenated amorphous carbon (a-C:H) and an oxygen ($O_2$) gas are introduced into the plasma reaction region A formed in the plasma reactor 110. Hydrogenated amorphous carbon (a-C:H) introduced into the plasma reaction region A is included in gas discharged from the process chamber (102 of FIG. 1), and oxygen ($O_2$) gas introduced into the plasma reaction region A is supplied from the gas supplying device (185 of FIG. 1).

Hydrogenated amorphous carbon (a-C:H) introduced into the plasma reaction region A is decomposed into excited carbon atoms (C*) and excited hydrogen atoms (H*) by a plasma reaction in the plasma reaction region A. An oxygen ($O_2$) gas introduced into the plasma reaction region A is composed into the excited oxygen atoms (O*).

A substitution (oxidation) reaction occurs between the excited carbon atoms (C*), the excited hydrogen atoms (H*), and the excited oxygen atoms (O*), which are generated by the plasma reaction in the plasma reaction region A so that carbon dioxide gas ($CO_2$), carbon monoxide gas (CO), and water vapor ($H_2O$) are generated.

That is, hydrogenated amorphous carbon (a-C:H) in the plasma reaction region A of the plasma reactor 150 reacts with the oxygen ($O_2$) gas that is additionally supplied by the plasma reaction so that a carbon dioxide ($CO_2$) gas, a carbon monoxide (CO) gas and water vapor ($H_2O$) are generated. Thus, hydrogenated amorphous carbon (a-C:H) is prevented from being included in the gas discharged from the plasma reactor 110 and introduced into the vacuum pump 104 contains hydrogenated amorphous carbon (a-C:H), which is the cause of the failure of the vacuum pump 104.

In the gas treatment operation (S220), hydrocarbon ($C_XH_Y$) included in the exhaust gas may be treated. In this case, although not shown, hydrocarbon ($C_XH_Y$) and nitrogen trifluoride ($NF_3$) are introduced into the plasma reaction region A formed in the plasma reactor 110. Hydrocarbon ($C_XH_Y$) introduced into the plasma reaction region A is included in the exhaust gas in the ACL process, and nitrogen trifluoride ($NF_3$) introduced into the plasma reaction region A is supplied from the gas supplying to device (185 of FIG. 1). In the plasma reaction region A, hydrocarbon ($C_XH_Y$) and nitrogen trifluoride ($NF_3$) are decomposed in units of atoms by the plasma reaction, are combined with each other and are decomposed into components including carbon tetrafluoride ($CF_4$), hydrofluoric acid (HF), ammonia ($NH_3$), and hydrogen cyanide (HCN) so that hydrocarbon ($C_XH_Y$) is treated.

Figure 12:
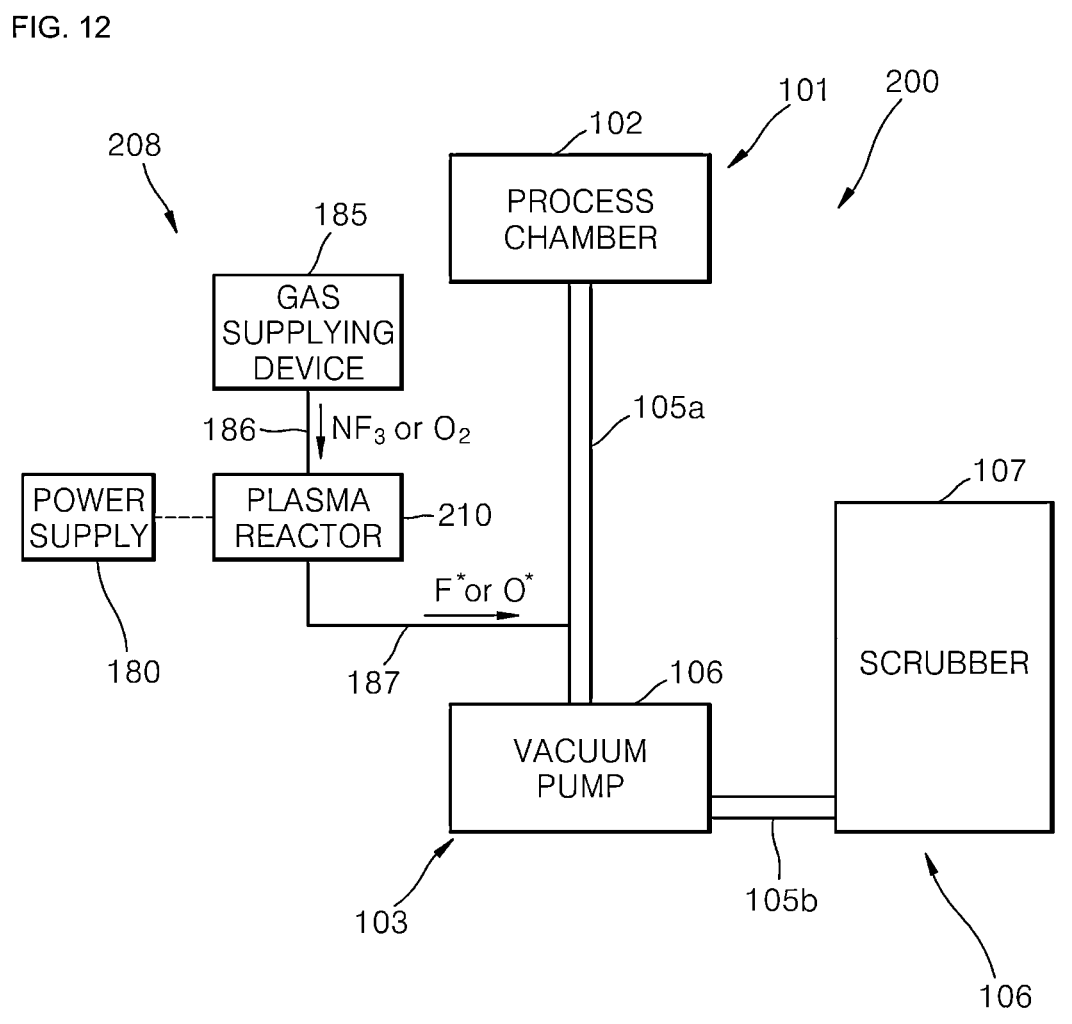

FIG. 12 is a block diagram showing the schematic configuration of a semiconductor manufacturing facility according to another embodiment of the present invention. Referring to FIG. 12, a semiconductor manufacturing facility 200 includes a semiconductor manufacturing equipment 101, an exhaust equipment 103 for discharging gas from the semiconductor manufacturing equipment 101, an exhaust gas treatment equipment 106 for treating gas discharged from the semiconductor manufacturing equipment 101 by using the exhaust equipment 103, and a plasma apparatus 208 for treating hydrogenated amorphous carbon (a-C:H) and hydrocarbon ($C_XH_Y$) by using plasma. Because the other configurations of the semiconductor manufacturing facility 200 except for the plasma apparatus 208 is roughly the same as those of the semiconductor manufacturing facility 100 shown in FIG. 1, only the plasma apparatus 208 will be described.

The plasma apparatus 208 includes a plasma reactor 210, a power supply 180 for supplying power to the plasma reactor 210, and a gas supplying device 185 for supplying gas to the plasma reactor 210. Because the other configurations of the plasma apparatus 208 except for the plasma reactor 210 are roughly the same as those of the plasma apparatus 108 shown in FIG. 1, only the plasma reactor 210 will be described.

Figure 13:
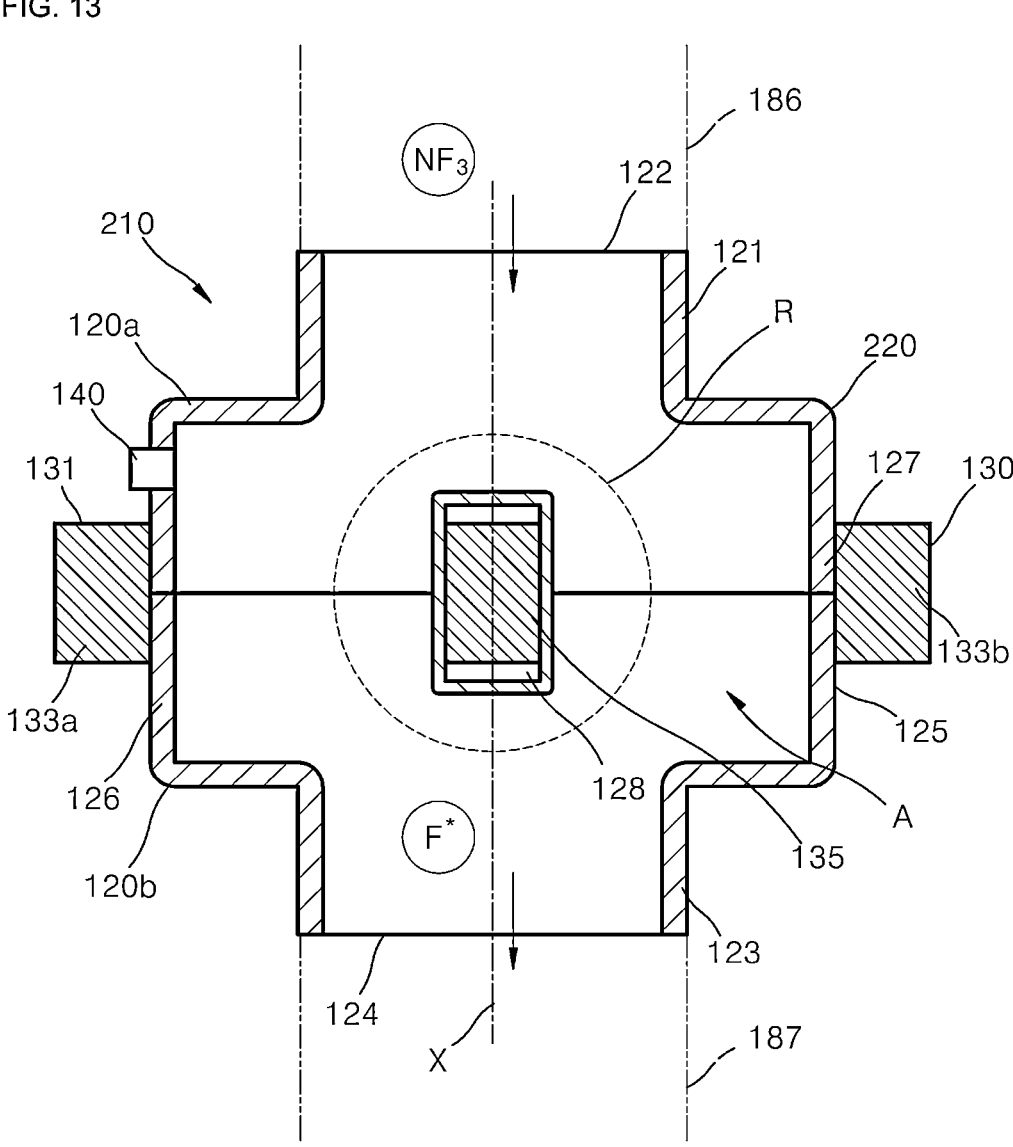
FIG. 13 is a longitudinal cross-sectional view of a plasma reactor in a plasma apparatus of the semiconductor manufacturing facility shown in FIG. 12.

FIG. 13 is a longitudinal cross-sectional view of the schematic configuration of the plasma reactor 210. Referring to FIG. 13, the plasma reactor 210 includes a reaction chamber 220, a magnetic core 130 arranged to surround the reaction chamber 220, an igniter 140 for plasma ignition, and a coil (not shown) wound on the magnetic core 130 and receiving power from the power supply 180. Because the other configurations of the plasma reactor 210 except for the configuration of the reaction chambre 220 are roughly the same as those of the reaction chamber 120 shown in FIG. 2, only the reaction chamber 220 will be described.

The reaction chamber 220 that is toroidal chamber includes a gas inlet portion 121, a gas discharge portion 123 spaced apart from the gas inlet portion 121, and a plasma reaction portion 125, which connects the gas inlet portion 121 to the gas discharge portion 123 and in which a plasma reaction occurs. The reaction chamber 120 decomposes gas supplied from the gas supplying device 185 by using plasma to generate reactive species. The entire configuration of the reaction chamber 220 has roughly the same configuration as that of the reaction chamber 120 shown in FIG. 2. However, the reaction chamber 220 is different from the reaction chamber 120 shown in FIG. 2 in that an inlet 122 of the gas inlet portion 121 communicates with the gas supplying device 185 through an inlet pipe 186, a discharge port 124 of the gas discharge portion 123 communicates with a chamber exhaust pipe (105a of FIG. 12) through a discharge pipe 187 and the reaction chamber 220 does not an additional gas injection port (121a of FIG. 2).

Gas flowing through the inlet 122 by plasma formed in the plasma reaction region A is decomposed to generate reactive species. As shown, when nitrogen trifluoride ($NF_3$) is introduced through the inlet 122, nitrogen trifluoride ($NF_3$) is decomposed in the plasma reaction region A so that excited fluorine atoms (F*) and fluorine ($F_2$) that are reactive species are generated. Specifically, in the plasma reaction region A, nitrogen trifluoride ($NF_3$) may be decomposed into components including nitrogen ($N_2$), fluorine ($F_2$), excited nitrogen atoms (N*), excited fluorine atoms (F*), and electrons e. Although not shown, when oxygen ($O_2$) is introduced through the inlet 122, oxygen ($O_2$) is decomposed in the plasma reaction region A so that excited oxygen atoms (O*) that are reactive species are generated. The reactive species generated in the plasma reactive region A are supplied to the chamber exhaust pipe (105*a* of FIG. 12) through the discharge pipe 187.

Although not shown, the method of operating the semiconductor manufacturing facility shown in FIG. 5 may also be applied to the semiconductor manufacturing facility 200 shown in FIG. 12. That is, excited oxygen atoms (O*) generated in the plasma reactor 210 in a state in which the ACL process is stopped, are supplied to the vacuum pump 106 so that hydrogenated amorphous carbon deposited in the vacuum pump 106 can be removed, and fluorine ($F_2$) generated in the plasma reactor 210 is supplied to the vacuum pump 106 so that hydrocarbon ($C_XH_Y$) deposited in the vacuum pump 106 can be removed.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A semiconductor manufacturing facility comprising:
   a process chamber in which an amorphous carbon layer (ACL) process is performed such that an ACL is formed;
   a vacuum pump that discharges a residual gas generated in the process chamber from the process chamber while the ACL process is being performed;
   a chamber exhaust pipe through which the process chamber and the vacuum pump communicate with each other;
   a plasma reactor configured to form a plasma reaction region using plasma; and
   a gas supplying device configured to supply oxygen ($O_2$) gas to the plasma reactor,
   wherein the residual gas is discharged from the process chamber and flows along the chamber exhaust pipe to form an exhaust gas,
   wherein the oxygen gas is decomposed by the plasma in the plasma reaction region to form a reactive species which is an excited gen atoms (O*),
   wherein the excited oxygen atoms (O) is introduced into the vacuum pump through the chamber exhaust pipe,
   wherein hydrogenated amorphous carbon deposited in the vacuum pump reacts with the excited oxygen atoms (O*) and is oxidized,
   wherein a thickness reduction rate of the hydrogenated amorphous carbon deposited in the vacuum pump due to the reaction with the excited oxygen atoms (O*) increases in proportion to an oxygen gas supply flow rate within a range below an upper limit of the oxygen gas supply flow rate,
   wherein the upper limit is an oxygen gas supply flow rate that represents the maximum generation rate of excited oxygen according to an operating power of the plasma reactor,
   wherein the gas supplying device supplies the oxygen gas to the plasma reactor at the upper limit.

2. The semiconductor manufacturing facility of claim 1, wherein the excited oxygen atoms (O*) are supplied to the chamber exhaust pipe through a discharge pipe through which the plasma reactor and the chamber exhaust pipe communicate with each other.

3. The semiconductor manufacturing facility of claim 1, wherein the plasma reactor is installed on the chamber exhaust pipe, wherein the plasma reactor decomposes hydrogenated amorphous carbon (a-C: H) included in the exhaust gas in the plasma reaction region into excited carbon atoms (C*) and excited hydrogen atoms (H*) wherein the excited carbon atoms (C*) react with the excited oxygen atoms (O*) and are oxidized into carbon dioxide ($CO_2$) or carbon monoxide (CO) before being introduced into the vacuum pump, and wherein the excited hydrogen atoms (H react with the excited oxygen atoms (O*) and are oxidized into water vapor (H2O) before being introduced into the vacuum pump.

4. The semiconductor manufacturing facility of claim 1, wherein the plasma reactor is installed on the chamber exhaust pipe.

5. A method of operating a semiconductor manufacturing facility, the semiconductor manufacturing facility comprising a process chamber in which an amorphous carbon layer (ACL) process is performed such that an ACL is formed, a vacuum pump that discharges a residual gas generated in the process chamber from the process chamber while the ACL process is being performed, a chamber exhaust pipe through which the process chamber and the vacuum pump communicate with each other; a plasma reactor configured to form a plasma reaction region using plasma, and a gas supplying device that supplies oxygen ($O_2$) gas to the plasma reactor, the method comprising:
   a deposited material removing step of removing hydrogenated amorphous carbon deposited in the vacuum pump,
   wherein, in the deposited material removing step, the oxygen gas supplied by the gas supplying device to the plasma reactor is decomposed in the plasma reaction region to generate a reactive species which is an excited oxygen atoms (O*), and the hydrogenated amorphous carbon deposited in the vacuum pump reacts with the excited oxygen atoms (O*) and is removed,
   wherein, in the deposited material removing step, a thickness reduction rate of the hydrogenated amorphous carbon deposited in the vacuum pump increases in proportion to an oxygen gas supply flow rate within a range below an upper limit of the oxygen gas supply flow rate,
   wherein the upper limit is an oxygen gas supply flow rate that represents the maximum generation rate of excited oxygen according to the operating power of the plasma reactor,
   wherein the gas supplying device supplies the oxygen gas to the plasma reactor at the upper limit.

* * * * *